United States Patent [19]

Usami et al.

[11] Patent Number: 5,423,287
[45] Date of Patent: Jun. 13, 1995

[54] CRYSTAL GROWING CELL

[75] Inventors: Ron Usami, Komae; Shunji Nagaoka, Tsukuba; Tsutomu Udaka, Tokyo; Kazunori Kawasaki, Kawagoe; Shoji Muramatsu, Houya, all of Japan

[73] Assignees: Nissan Motor Company, Ltd., Yokohama; National Space Development Agency of Japan, Tokyo, both of Japan

[21] Appl. No.: 155,371

[22] Filed: Nov. 22, 1993

[30] Foreign Application Priority Data

Nov. 25, 1992 [JP] Japan .................................. 4-314535

[51] Int. Cl.$^6$ ................................................ C30B 35/00
[52] U.S. Cl. ........................................ 117/206; 117/200; 117/224; 422/99
[58] Field of Search ............... 117/200, 202, 203, 206, 117/224, 901; 422/99

[56] References Cited

U.S. PATENT DOCUMENTS

| | | | |
|---|---|---|---|
| 3,525,594 | 8/1970 | Barrett | 117/200 |
| 4,917,707 | 4/1990 | Charamonte et al. | 117/206 |
| 5,266,284 | 11/1993 | Heilig et al. | 117/200 |

Primary Examiner—R. Bruce Breneman
Assistant Examiner—Felisa Garrett
Attorney, Agent, or Firm—Lowe, Price, LeBlanc & Becker

[57] ABSTRACT

Crystal growing cell including first and second casings. The first casing has a first solution chamber for containing a first solution therein. The first solution chamber has an opening. The second casing has a closing member placed therein for movement in a first direction and in a second direction opposite to the first direction. The second casing has a third casing placed therein. The third casing is fixed to the first casing around the opening to form a second solution chamber for containing a second solution therein. The closing member is moved in the first direction to close the opening so as to separate the first solution chamber from the second solution chamber. The closing member is moved in the second direction to open the opening so as to connect the first solution chamber to the second solution chamber.

13 Claims, 4 Drawing Sheets

CRYSTAL GROWING CELL

BACKGROUND OF THE INVENTION

This invention relates to a crystal growing cell for diffusing a first solution into a second solution for growing a crystal therein.

Crystal growing cells have been used for growing a crystal in an environment of very small or almost no gravity. Such a conventional crystal growing cell includes first and second solution chambers provided on the opposite sides of a passage. The first solution chamber contains a sample solution such as protein solution, and the second solution chamber contains a precipitant solution such as salt solution. A slider is placed in the passage to separate the first and second solution chambers. The slider has a third solution chamber for containing a buffer solution.

To start crystal growth, the slider may be moved in the passage to bring the third solution chamber into alignment with the first and second solution chambers so as to connect the first and second solution chambers through the third solution chamber. Under this condition, the precipitant solution comes into contact with and diffuses into the sample solution. When the sample solution is saturated with the precipitant, the crystal growth starts.

One of the difficulties encountered with the conventional crystal growing cell is the tendency of the solutions to be polluted with a pollutant absorbed on the surface of the slider. In addition, a great force is required to slide the slider on which a great pressure is applied to prevent solution leakage. Furthermore, the solutions will be stirred when the slider is moved to bring the third solution chamber into alignment with the first and second solution chambers.

SUMMARY OF THE INVENTION

It is a main object of the invention to provide an improved crystal growing cell which can eliminate the tendency of impurities to be mixed with the solutions used in growing a crystal.

Another object of the invention is to provide an improved crystal growing cell which can prevent solution leakage.

Still another object of the invention is to provide an improved crystal growing cell which can bring the solutions into contact with each other without stirring them.

There is provided, in accordance with the invention, a crystal growing cell which comprises a first and second casing. The first casing has a first solution chamber for containing a first solution therein. The first solution chamber has an opening. The second casing has a closing member placed therein for movement in a first direction and in a second direction opposite to the first direction. The second casing has a third casing placed therein. The third casing is fixed to the first casing around the opening to form a second solution chamber for containing a second solution therein. The crystal growing cell also includes means for moving the closing member in the first direction to close the opening so as to separate the first solution chamber from the second solution chamber and for moving the closing member in the second direction to open the opening so as to connect the first solution chamber to the second solution chamber.

In another aspect of the invention, the crystal growing cell comprises first and second casings. The first casing has a first solution chamber for containing a first solution therein. The first solution chamber has first and second openings. The second casing has a first closing member placed therein for movement in a first direction and in a second direction opposite to the first direction. The second casing has a third casing placed therein. The third casing is fixed to the first casing around the first opening to form a second solution chamber for containing a second solution therein. The first closing member is moved in the first direction to close the first opening so as to separate the first solution chamber from the second solution chamber. The first closing member is moved in the second direction to open the first opening so as to connect the first solution chamber to the second solution chamber. The crystal growing cell also comprises fourth and fifth casings. The fourth casing has a second closing member placed therein for movement in a third direction and in a fourth direction opposite to the third direction. The fourth casing has a fifth casing placed therein. The fifth casing is fixed to the first casing around the second opening to form a third solution chamber for containing a third solution therein. The second closing member is moved in the third direction to close the second opening so as to separate the first solution chamber from the third solution chamber. The second closing member is moved in the fourth direction to open the second opening so as to connect the first solution chamber to the third solution chamber.

BRIEF DESCRIPTION OF THE DRAWINGS

The invention will be described in greater detail by reference to the following description taken in connection with the accompanying drawings, in which.

DETAILED DESCRIPTION OF THE INVENTION

Figure 1:
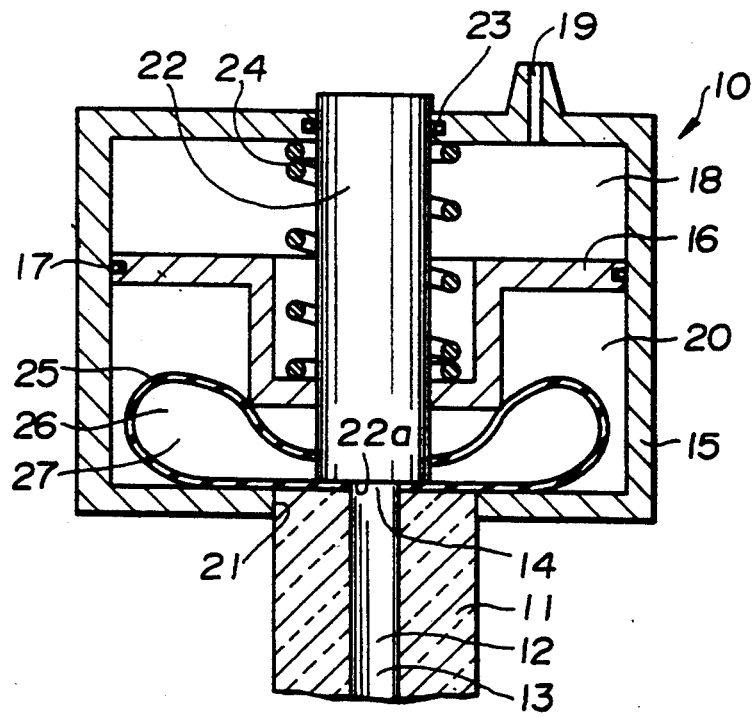
FIG. 1 is a fragmentary vertical sectional view showing one embodiment of a crystal growing cell made in accordance with the invention.

With reference to the drawings and in particular to FIG. 1, there is shown one embodiment of a crystal growing cell embodying the invention. The crystal growing cell, generally designated by the numeral 10, includes a first casing 11 which has a first solution chamber 12 for containing a first solution 13. The first solution chamber 12 opens at its upper end through an opening 14. Preferably, the first casing 11 is made of a rigid transparent material such as a quartz glass or the like through which optical beams can pass for observation. The crystal growing cell 10 also includes a second casing 15 having a gastight chamber therein. A partition 16, which is mounted on the side wall of the second casing 15 through a sealing member 17 for sliding movement within the gastight chamber in upward and downward directions, divides the gastight chamber into upper and lower pressure chambers 18 and 20 on the opposite sides thereof. The upper pressure chamber 18 is connected to its exterior through a vent hole 19 which is shown as extending through the upper wall of the second casing 15. The lower wall of the second casing 15 has a through-hole 21 into which the upper end of the first casing 11 is fitted sealingly.

A piston-shaped closing member 22, which extends through the upper pressure chamber 18 into the lower pressure chamber 20, is fixed to the partition 16 for movement in unison therewith. The closing member 22 is supported for sliding movement through a sealing member 23 by the upper wall of the second casing 15. The closing member 22 is urged toward its lowermost position closing the opening 14 of the first solution chamber 12 with its lower end surface 22a by means of a compression spring 24 placed around the closing member 22 between the upper wall of the second casing 15 and the partition 16.

A flexible casing 25, which is placed in the lower pressure chamber 20, has a second solution chamber 26 for containing a second solution 27. The flexible casing 25 is sealingly fixed to the first casing 11 around the opening 14 of the first solution chamber 12 so that the second solution chamber 26 is connected to the first solution chamber 12. The flexible casing 25 is also sealingly fixed to the closing member 22 around its peripheral surface so that the second solution chamber 26 deforms with movement of the closing member 22. The flexible casing 25 may be made of a soft resilient material such as rubber or the like.

The pressures in the upper and lower pressure chambers 18 and 20 and the resilient force of the compression spring 24 are adjusted to permit the closing member 22 to close the opening 14 in a direction normal to the direction in which the first solution chamber 12 opens into the second solution chamber 26 so as to separate the second solution chamber 26 from the first solution chamber 12.

The operation is as follows. First of all, the closing member 22 is held at its lowermost position to close the opening 14 with its bottom surface 22a. The first solution (sample solution) 13, that is, protein solution, is introduced into the first solution chamber 12, and the second solution (precipitant solution) 27, that is, salt solution, is introduced into the second solution chamber 26. Since the closing member 22 is held at its lowermost position by the resilient force of the compression spring 24, the protein solution is separated from the salt solution.

Figure 2:
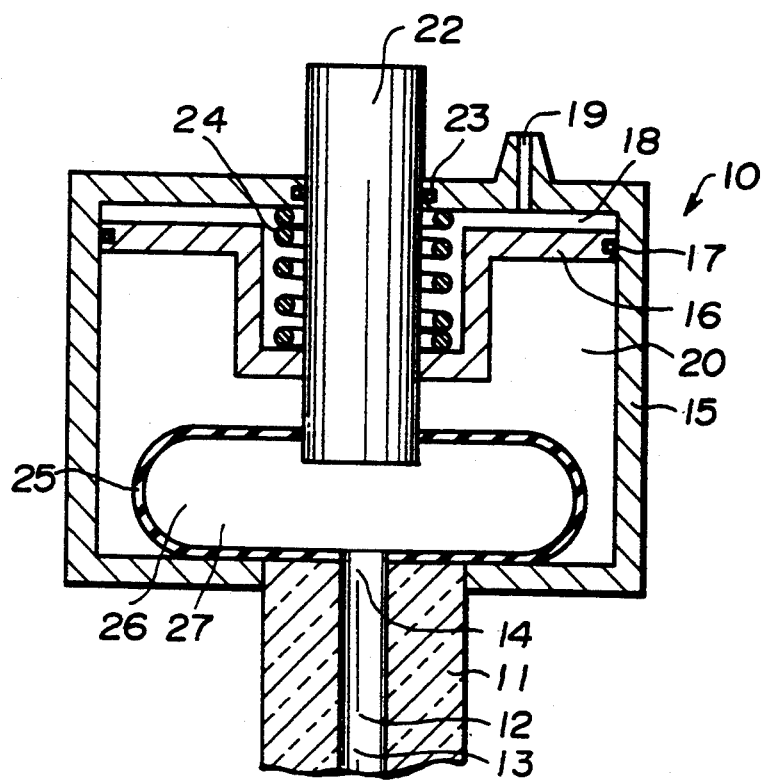
FIG. 2 is a vertical fragmentary sectional view showing the crystal growing cell of FIG. 1 with the closing member at an upper position connecting the first solution chamber to the second solution chamber.

To test or observe the crystal growth in the environment of very small or almost no gravity with the use of the crystal growing cell 10, the gas may be discharged from the upper pressure chamber 18 through the vent hole 19 to decrease the pressure in the upper pressure chamber 18. This causes the partition 16 to move upward to open the opening 14 with the compression spring 24 being compressed, as shown in FIG. 2. As a result, the salt solution 27 comes into contact with and diffuses into the protein solution 13. When the protein solution 13 is saturated with salt, the crystal growth is started. The crystal growth can be observed with the use of optical beams passing through the first casing 11 in two directions perpendicular to each other.

With the use of the crystal growing cell 10 of the invention, it is, therefore, possible to adjust the speed of upward movement of the closing member 22 and the degree to which the first and second solutions 13 and 27 come into contact with each other by controlling the flow rate of the gas discharged through the vent hole 19. There is no tendency of impurities to pollute the first and second solutions 13 and 27. The crystal growing cell 10 can prevent solution leakage and can bring the first and second solutions into contact with each other without stirring. Furthermore, it is possible to absorb the pressure change caused by the crystal growth.

Figure 3:
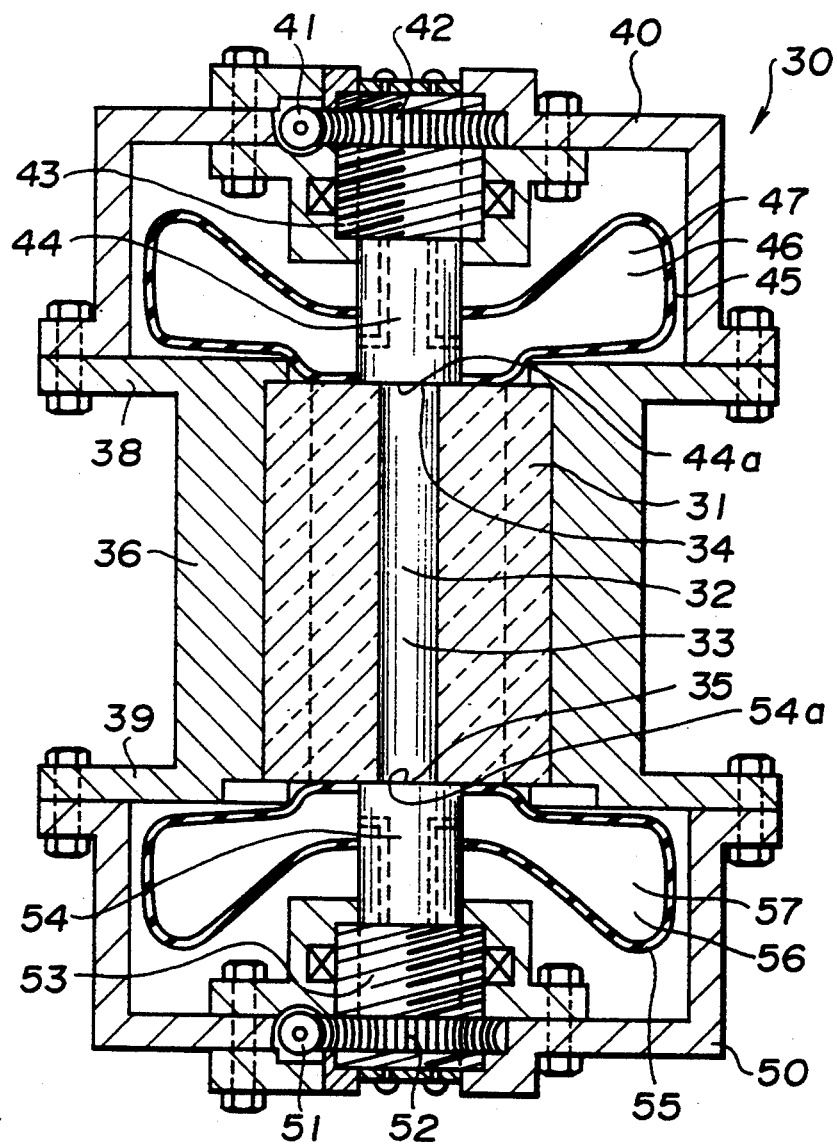
FIG. 3 is a vertical sectional view showing a second embodiment of the crystal growing cell of the invention.
Figure 4:
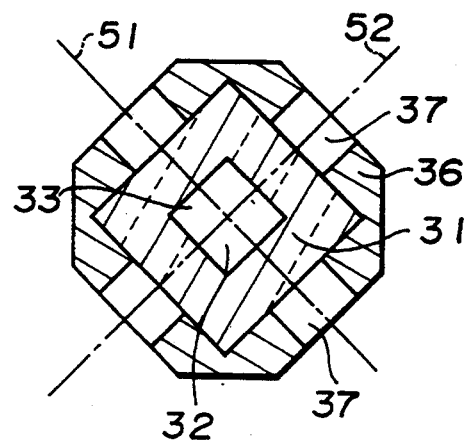
FIG. 4 is a horizontal sectional view showing the first casing of the crystal growing cell of FIG. 3.

Referring to FIG. 3, there is shown a second embodiment of the crystal growing cell of the invention. The crystal growing cell, generally designated by the numeral 30, includes a first casing 31 which has a first solution chamber 32 for containing a first solution 33. The first solution chamber 32 opens at its upper end through an opening 34 and at its lower end through an opening 35. Preferably, the first casing 31 is made of a rigid transparent material such as a quartz glass or the like through which optical beams can pass for observation. The first casing 31 is placed in a cell casing 36 provided with observation windows 37, as shown in FIG. 4. The cell casing 36 is provided at its upper end with an upper flange 38 on which an upper casing 40 is fixed. The upper casing 40 contains a drive mechanism including a worm gear 41 driven by an electric motor (not shown), a worm wheel 42 having an internally threaded gear held in mesh engagement with the worm gear 41, a ball screw 43 held in mesh engagement with the worm wheel 42 for upward and downward movement with rotation of the worm wheel 42, and an upper closing member 44 fixed to the ball screw 43. The upper closing member 44 has a bottom surface 44a for closing the upper opening 34 of the first solution chamber 32 at its lowermost position. A flexible casing 45, which is placed in the upper casing 40, has a second solution chamber 46 for containing a second solution 47. The flexible casing 45 is sealingly fixed to the first casing 31 around the upper opening 34 of the first solution chamber 32 so that the second solution chamber 46 is connected to the first solution chamber 32. The flexible casing 45 is also sealingly fixed to the closing member 44 around its peripheral surface so that the second solution chamber 46 deforms with movement of the closing member 44. The flexible casing 45 may be made of a soft resilient material such as rubber or the like. The closing member 44 closes the upper opening 34 in a direction normal to the direction in which the first solution chamber 32 opens into the second solution chamber 46 so as to separate the second solution chamber 46 from the first solution chamber 32.

The cell casing 36 is also provided at its lower end with a lower flange 39 to which a lower casing 50 is fixed. The lower casing 50 contains a drive mechanism including a worm gear 51 driven by an electric motor (not shown), a worm wheel 52 having an internally threaded gear held in mesh engagement with the worm gear 51, a ball screw 53 held in mesh engagement with the worm wheel 52 for upward and downward movement with rotation of the worm wheel 52, and an upper closing member 54 fixed to the ball screw 53. The upper closing member 54 has a top surface 54a for closing the lower opening 35 of the first solution chamber 32 at its uppermost position. A flexible casing 55, which is placed in the lower casing 50, has a third solution chamber 56 for containing a third solution 57. The flexible casing 55 is sealingly fixed to the first casing 31 around the lower opening 35 of the first solution chamber 32 so that the third solution chamber 56 is connected to the first solution chamber 32. The flexible casing 55 is also sealingly fixed to the closing member 54 around its peripheral surface so that the third solution chamber 56 deforms with movement of the closing member 54. The flexible casing 55 may be made of a soft resilient material such as rubber or the like. The closing member 54 closes the lower opening 35 in a direction normal to the direction in which the first solution chamber 32 opens into the third solution chamber 56 so as to separate the third solution chamber 56 from the first solution chamber 32.

The operation is as follows. First of all, the closing member 44 is held at its lowermost position to close the upper opening 34 with its bottom surface 44a, whereas the closing member 54 is held at its uppermost position to close the lower opening 35 with its top surface 54a. The first solution (sample solution) 33, that is, protein solution, is introduced into the first solution chamber 32, the second solution (precipitant solution) 47, that is, salt solution, is introduced into the second solution chamber 46, and the third solution (crystal growth stopping or crystal retaining solution) 57 is introduced into the third solution chamber 56. The closing member 44 is held at its lowermost position to separate the protein solution 33 from the salt solution 47. The closing member 54 is held at its uppermost position to separate the protein solution 33 from the crystal growth stopping or crystal retaining solution 57.

Figure 5:
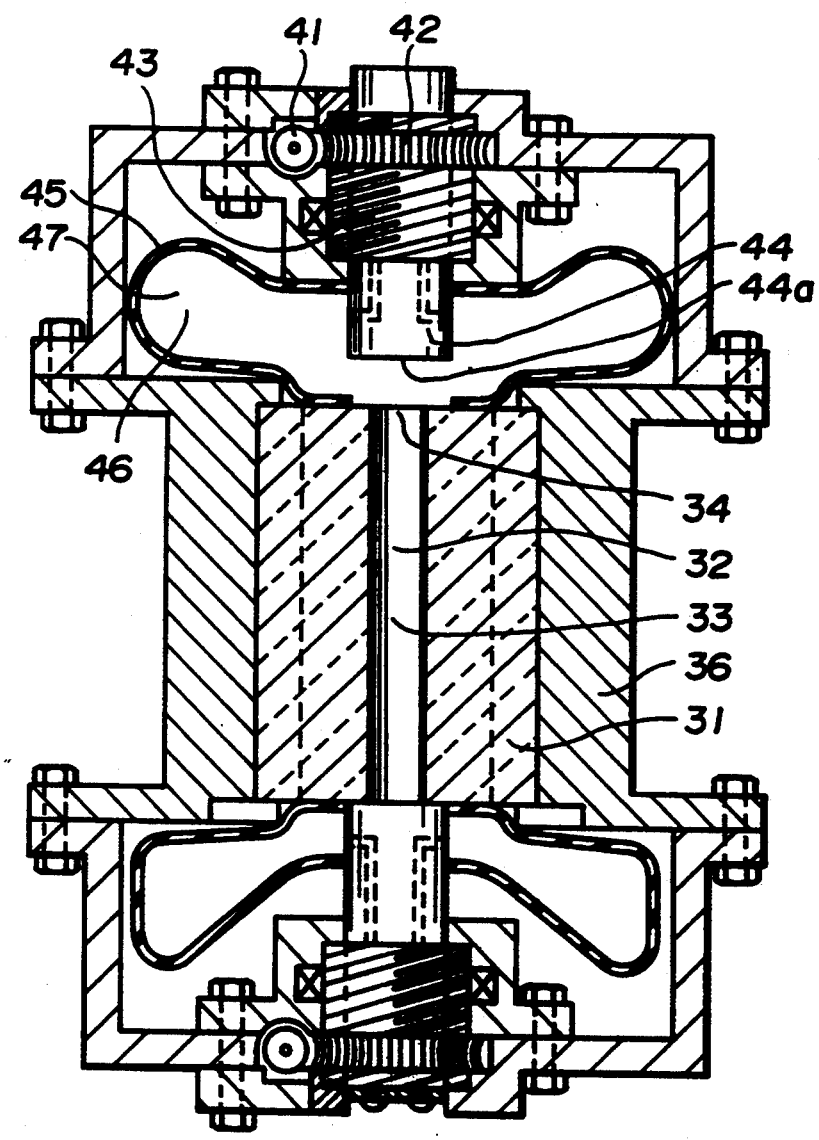
FIG. 5 is a vertical sectional view of the crystal growing cell of FIG. 3 with the upper closing member at an upper position connecting the first solution chamber to the second solution chamber.
Figure 6:
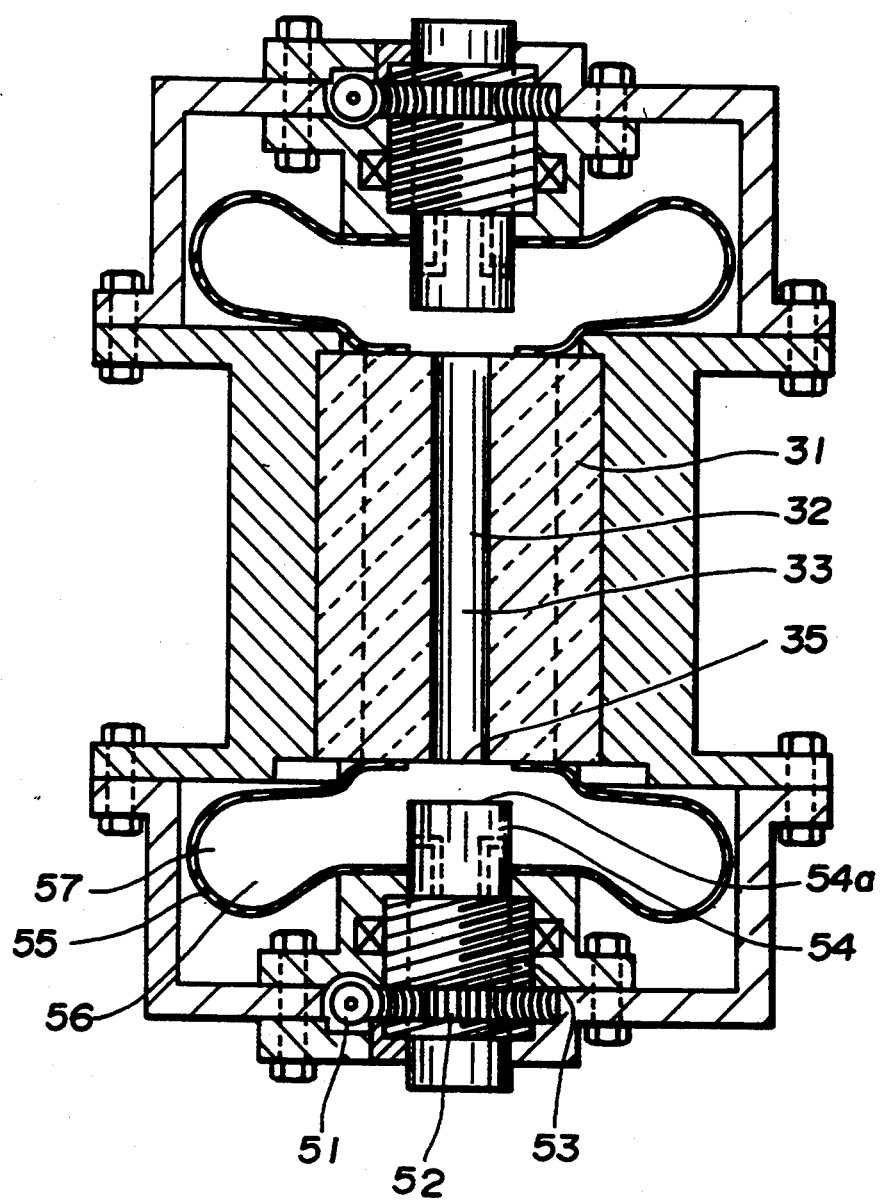
FIG. 6 is a vertical sectional view of the crystal growing cell of FIG. 3 with the upper closing member at an upper position connecting the first solution chamber to the second solution chamber and with the lower closing member at a lower position connecting the first solution chamber to the third solution chamber.

To test or observe the crystal growth in the environment of very small or almost no gravity with the use of the crystal growing cell 30, the unshown electric motor may be actuated to move the closing member 44 upward so as to open the upper opening 34, as shown in FIG. 5, through the drive mechanism including the worm gear 41, the worm wheel 42 and the ball screw 43. When the upper opening 34 opens, the salt solution 47 comes into contact with and diffuses into the protein solution 33. When the protein solution is saturated with salt, the crystal growth is started. The crystal growth can be observed with the use of optical beams passing through the observation windows 37 in two directions perpendicular to each other.

To stop the crystal growth, the unshown electric motor may be actuated to move the closing member 54 downward so as to open the lower opening 35 through the drive mechanism including the worm gear 51, the worm wheel 52 and the ball screw 53. When the lower opening 35 opens, the crystal growth stopping solution 57 comes into contact with and diffuses into the protein solution 33. As a result, the protein concentration decreases to stop the crystal growth. If the third solution chamber 56 contains a crystal retaining solution, it is possible to retain the crystal by actuating the unshown electric motor to move the closing member 54 downward so as to open the lower opening 35.

With the use of the crystal growing cell 30 of the invention, it is, therefore, possible to adjust the speeds of upward movement of the first and second closing members 44 and 45 and the degree to which the second and third solutions 47 and 57 come into contact with the first solution 33 by controlling the speeds of rotation of the electric motors used to drive the first and second closing members 44 and 54, respectively. There is no tendency of impurities to pollute the first, second and third solutions 33, 47 and 27. The crystal growing cell 30 can prevent solution leakage and can bring the second and third solutions into contact with the first solution without stirring. Furthermore, it is possible to absorb the pressure change caused by the crystal growth.

What is claimed is:

1. A crystal growing cell comprising:
   a first casing having a first solution chamber for containing a first solution therein, the first solution chamber having an opening;
   a second casing having a closing member placed therein for movement in a first direction and in a second direction opposite to the first direction, the second casing having a flexible casing placed therein, the flexible casing being fixed to the first casing around the opening to form a second solution chamber for containing a second solution therein; and
   means for moving the closing member in the first direction to close the opening so as to separate the first solution chamber from the second solution chamber and for moving the closing member in the second direction to open the opening so as to connect the first solution chamber to the second solution chamber.

2. The crystal growing cell as claimed in claim 1, wherein the closing member has an end surface for closing the opening in a direction normal to the direction in which the first solution chamber opens.

3. The crystal growing cell as claimed in claim 1, wherein the closing member has a peripheral surface, and the flexible casing is fixed to the closing member around the peripheral surface.

4. The crystal growing cell as claimed in claim 1, wherein the first casing is made of a rigid transparent material for permitting passage of optical beams for observation.

5. The crystal growing cell as claimed in claim 1, wherein the first solution is a sample solution and the second solution is a precipitant solution.

6. The crystal growing cell as claimed in claim 1, wherein the first solution is a sample solution and the second solution is a crystal growth stopping solution.

7. The crystal growing cell as claimed in claim 1, wherein the first solution is a sample solution and the second solution is a crystal retaining solution.

8. A crystal growing cell comprising:
   a first casing having a first solution chamber for containing a first solution therein, the first solution chamber having first and second openings;
   a second casing having a first closing member placed therein for movement in a first direction and in a second direction opposite to the first direction, the second casing having a first flexible casing placed therein, the first flexible casing being fixed to the first casing around the first opening to form a second solution chamber for containing a second solution therein;
   means for moving the first closing member in the first direction to close the first opening so as to separate the first solution chamber from the second solution chamber and for moving the first closing member in the second direction to open the first opening so as to connect the first solution chamber to the second solution chamber;

a third casing having a second closing member placed therein for movement in a third direction and in a fourth direction opposite to the third direction, the third casing having a second flexible casing placed therein, the second flexible casing being fixed to the first casing around the second opening to form a third solution chamber for containing a second solution therein; and means for moving the second closing member in the third direction to close the second opening so as to separate the first solution chamber from the third solution chamber and for moving the second closing member in the fourth direction to open the second opening so as to connect the first solution chamber to the third solution chamber.

9. The crystal growing cell as claimed in claim 8, wherein the first closing member has an end surface for closing the first opening in a direction normal to the direction in which the first solution chamber opens into the second chamber, and wherein the second closing member has an end surface for closing the second opening in a direction normal to the direction in which the first solution chamber opens into the third chamber.

10. The crystal growing cell as claimed in claim 8, wherein the first closing member has a peripheral surface, the first flexible casing being fixed to the first closing member around the peripheral surface thereof, and wherein the second closing member has a peripheral surface, the second flexible casing being fixed to the second closing member around the peripheral surface thereof.

11. The crystal growing cell as claimed in claim 8, wherein the first casing is made of a rigid transparent material for permitting passage of optical beams for observation.

12. The crystal growing cell as claimed in claim 8, wherein the first solution is a sample solution, the second solution is a precipitant solution, and the third solution is a crystal growth stopping solution.

13. The crystal growing cell as claimed in claim 8, wherein the first solution is a sample solution, the second solution is a precipitant solution, and the third solution is a crystal retaining solution.

* * * * *